(12) United States Patent
Kobayashi

(10) Patent No.: US 7,482,530 B2
(45) Date of Patent: Jan. 27, 2009

(54) SIGNAL PROCESSING APPARATUS AND METHOD, RECORDING MEDIUM AND PROGRAM

(75) Inventor: Yoshiyuki Kobayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 556 days.

(21) Appl. No.: 11/082,763

(22) Filed: Mar. 18, 2005

(65) Prior Publication Data

US 2005/0211077 A1 Sep. 29, 2005

(30) Foreign Application Priority Data

Mar. 25, 2004 (JP) .............................. 2004-089292

(51) Int. Cl.
*G10H 1/12* (2006.01)
*G10H 7/00* (2006.01)
*G06K 9/36* (2006.01)
*G06F 17/00* (2006.01)

(52) U.S. Cl. ........................... 84/661; 84/603; 382/239; 700/94

(58) Field of Classification Search .................. 84/661, 84/603; 382/239; 700/94
See application file for complete search history.

(56) References Cited

U.S. PATENT DOCUMENTS

| | | | | |
|---|---|---|---|---|
| 3,821,797 | A * | 6/1974 | Ota et al. | 360/24 |
| 3,976,863 | A * | 8/1976 | Engel | 708/306 |
| 4,216,691 | A * | 8/1980 | Bean | 84/679 |
| 4,315,452 | A * | 2/1982 | Yoshinari | 84/702 |
| 4,599,567 | A * | 7/1986 | Goupillaud et al. | 324/76.33 |
| 4,674,125 | A * | 6/1987 | Carlson et al. | 382/303 |
| 5,150,413 | A * | 9/1992 | Nakatani et al. | 704/249 |
| 5,442,130 | A * | 8/1995 | Kitayama et al. | 84/661 |
| 5,473,759 | A * | 12/1995 | Slaney et al. | 704/266 |
| 5,502,663 | A * | 3/1996 | Lyon | 708/300 |
| 5,744,742 | A * | 4/1998 | Lindemann et al. | 84/623 |
| 5,886,276 | A * | 3/1999 | Levine et al. | 84/603 |
| 6,046,395 | A * | 4/2000 | Gibson et al. | 84/603 |
| 6,513,004 | B1 * | 1/2003 | Rigazio et al. | 704/254 |
| 6,519,558 | B1 * | 2/2003 | Tsutsui | 704/207 |
| 6,581,081 | B1 * | 6/2003 | Messerly et al. | 708/322 |
| 6,976,046 | B2 * | 12/2005 | Guevorkian et al. | 708/400 |
| 7,002,380 | B2 * | 2/2006 | De Gouy et al. | 327/115 |

(Continued)

FOREIGN PATENT DOCUMENTS

JP 58-201032 11/1983

*Primary Examiner*—Walter Benson
*Assistant Examiner*—Christina Russell
(74) *Attorney, Agent, or Firm*—Oblon, Spivak, McClelland, Maier & Neustadt, P.C.

(57) ABSTRACT

A signal processing apparatus and method is disclosed by which signal components of different musical intervals of an audio signal can be obtained with a small amount of arithmetic operation. A re-sampling section re-samples an audio signal inputted thereto with a sampling frequency equal to a power-of two times a frequency at a boundary of an octave. An octave dividing block divides the audio signals outputted from the re-sampling section into audio signals of octaves and outputs the resulting audio signals to respective band-pass filter banks. Each of the band-pass filter banks includes 12 band-pass filters and extracts and outputs audio signals of 12 musical intervals from the audio signals of one octave. The invention can be applied to a signal processing apparatus which analyzes, for example, signal components of musical intervals of an audio signal.

10 Claims, 14 Drawing Sheets

U.S. PATENT DOCUMENTS

| | | | |
|---|---|---|---|
| 7,076,315 B1 * | 7/2006 | Watts | 700/94 |
| 7,136,493 B2 * | 11/2006 | Coats et al. | 381/61 |
| 7,242,782 B1 * | 7/2007 | Kasai et al. | 381/97 |
| 2002/0057808 A1 * | 5/2002 | Goldstein | 381/106 |
| 2002/0147595 A1 * | 10/2002 | Baumgarte | 704/500 |
| 2003/0065489 A1 * | 4/2003 | Guevorkian et al. | 703/2 |
| 2003/0118107 A1 * | 6/2003 | Itakura et al. | 375/240.19 |
| 2003/0223588 A1 * | 12/2003 | Trammell et al. | 381/17 |
| 2004/0086188 A1 * | 5/2004 | Owada | 382/233 |
| 2005/0141773 A1 * | 6/2005 | Mizuno | 382/239 |
| 2005/0180539 A1 * | 8/2005 | De Gouy et al. | 377/47 |
| 2005/0211072 A1 * | 9/2005 | Lu et al. | 84/612 |
| 2005/0216259 A1 * | 9/2005 | Watts | 704/205 |
| 2005/0228518 A1 * | 10/2005 | Watts | 700/94 |
| 2006/0078140 A1 * | 4/2006 | Goldstein | 381/312 |
| 2006/0159355 A1 * | 7/2006 | Mizuno | 382/239 |
| 2008/0075303 A1 * | 3/2008 | Kim et al. | 381/103 |

* cited by examiner

FIG.14

| OCTAVE | DOWN SAMPLING NUMBER (DS) | TAP NUMBER (Tap) | Tap÷DS×12 |
|---|---|---|---|
| O8 | 1 | 128 | 1536 |
| O7 | 1 | 256 | 3072 |
| O6 | 1 | 512 | 6144 |
| O5 | 1 | 1024 | 12288 |
| O4 | 1 | 2048 | 24576 |
| O3 | 1 | 4096 | 49152 |
| O2 | 1 | 8192 | 98304 |
| O1 | 1 | 16384 | 196608 |
| TOTAL | | | 391680 |

FIG.15

| OCTAVE | DOWN SAMPLING NUMBER (DS) | TAP NUMBER (Tap) | Tap÷DS×2 |
|---|---|---|---|
| O8 | 2 | 256 | 256 |
| O7 | 4 | 256 | 128 |
| O6 | 8 | 256 | 64 |
| O5 | 16 | 256 | 32 |
| O4 | 32 | 256 | 16 |
| O3 | 64 | 256 | 8 |
| O2 | 128 | 256 | 4 |
| O1 | 256 | 256 | 2 |
| SUBTOTAL | | | 510 |

FIG.16

| OCTAVE | DOWN SAMPLING NUMBER (DS) | TAP NUMBER (Tap) | Tap÷DS×12 |
|---|---|---|---|
| O8 | 2 | 64 | 384 |
| O7 | 4 | 64 | 192 |
| O6 | 8 | 64 | 96 |
| O5 | 16 | 64 | 48 |
| O4 | 32 | 64 | 24 |
| O3 | 64 | 64 | 12 |
| O2 | 128 | 64 | 6 |
| O1 | 256 | 64 | 3 |
| SUBTOTAL | | | 765 |

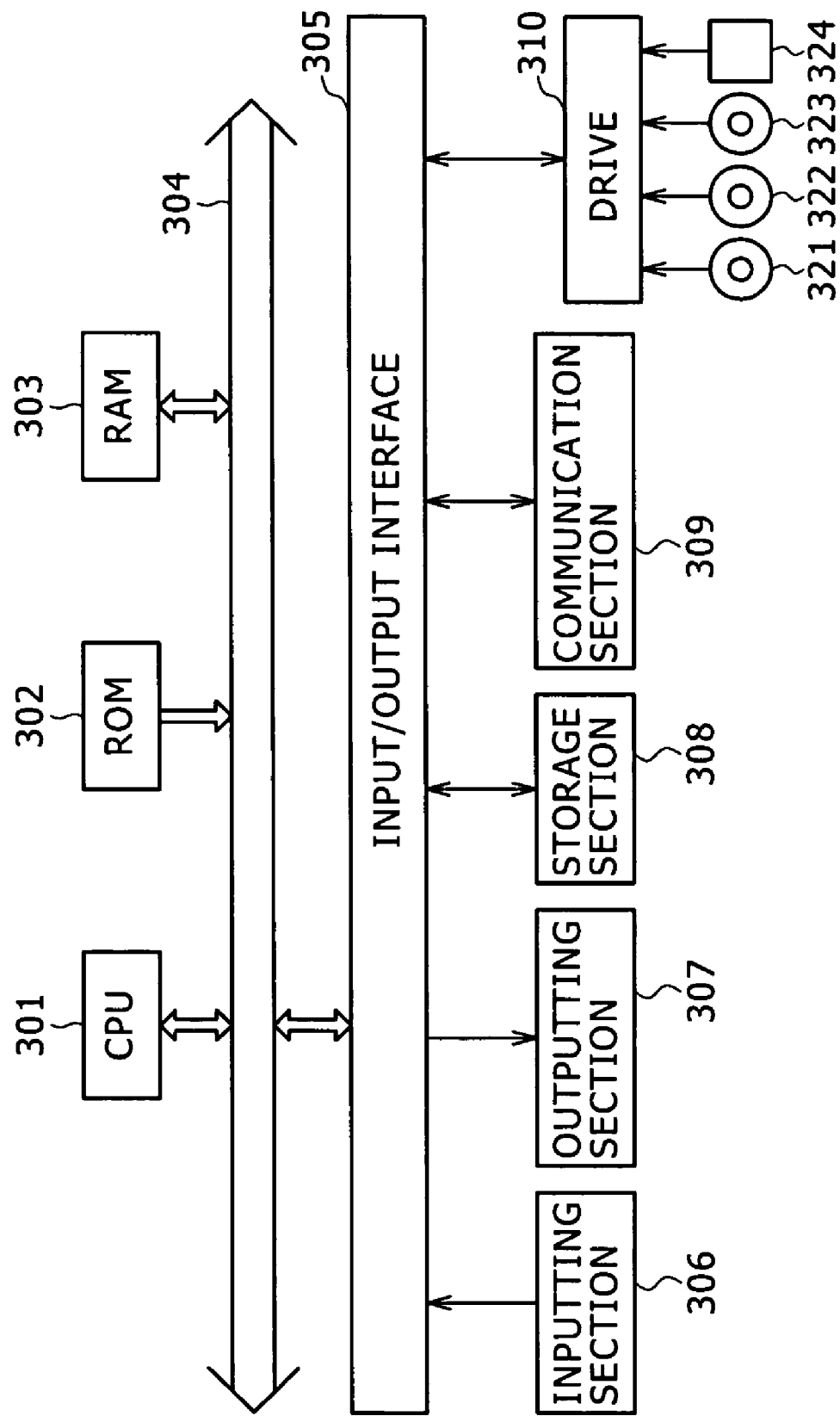

SIGNAL PROCESSING APPARATUS AND METHOD, RECORDING MEDIUM AND PROGRAM

BACKGROUND OF THE INVENTION

This invention relates to a signal processing apparatus and method, a recording medium and a program, and more particularly to a signal processing apparatus and method, a recording medium and a program by which signal components of different musical intervals of an audio signal can be obtained.

Various musical interval estimation methods have been proposed wherein signal components obtained by sampling a digital audio (music) signal with a predetermined sampling frequency are classified into signal components of different musical intervals (scales) such as, for example, C, C#, D, D#, E, F, F#, G, G#, A, A# and B (which correspond to do, do#, re, re#, mi, fa, fa#, so, so#, la, la# and ti, respectively). Such estimation of musical intervals of an audio signal is utilized, for example, for automatic music transcription, music analysis (melody analysis) and so forth.

The twelve musical intervals of C, C#, D, D#, E, F, F#, G, G#, A, A# and B construct one octave, and the frequencies of musical intervals of one octave are equal to twice those of musical intervals lower by one octave than the musical intervals. In other words, musical intervals are distributed logarithmically (exponentially) with respect to the frequency. For example, if the frequency (center frequency) of the musical interval of A (la) of a certain octave is 440 Hz, then the frequency of the musical interval of A (la) higher by one octave is 880 Hz which is equal to twice 440 Hz. Meanwhile, for example, the difference in frequency (center frequency) between C4 (do) and C#4 (do#) which are adjacent each other is approximately 6 Hz in the octave 2 on the low frequency region side, but is approximately 123 Hz in the octave 6 on the high frequency region side.

Also the frequency bands (bandwidths) of the musical intervals of a certain octave are twice those of the musical intervals lower by one octave.

Incidentally, as an estimation method of musical intervals of an audio signal (signal components of musical intervals included in the audio signal), for example, a method which uses short-time Fourier transform and a method which uses wavelet conversion are available.

The short-time Fourier transform analyzes frequency components at frequencies spaced at equal distances from each other while musical intervals are distributed logarithmically with respect to the frequency as described above. Therefore, according to a musical interval estimation method which uses the short-time Fourier transform, there is a tendency that the frequency resolution is insufficient on the low frequency region side but is excessive on the high frequency region side.

In particular, in the short-time Fourier transform, not only high musical intervals, that is, musical intervals having broad frequency bands, but also low musical intervals, that is, musical intervals having narrow frequency band, are analyzed with frequencies spaced at equal distances from each other. Therefore, the frequency resolution of high musical intervals is relatively high while the frequency resolution of low musical intervals is relatively low.

On the other hand, if it is tried to assure a sufficient frequency resolution on the low frequency region side, then the time resolution becomes excessive on the low frequency region side. On the contrary, if it is tried to assure a sufficient and necessary frequency resolution on the high frequency region side, then the time resolution becomes insufficient on the high frequency region side.

Further, when the short-time Fourier transform is used to estimate musical intervals, it is necessary to take it consideration that musical intervals are distributed logarithmically with respect to the frequency to apply a non-linear process for a result of analysis of frequency components at equal distances obtained by the Fourier transform. Due to the non-linear process, the musical interval estimation method which uses the short-time Fourier transform has a problem that the process is complicated.

Thus, according to a musical interval estimation method which uses the wavelet conversion, it is considered that musical intervals can be estimated with an ideal time-base resolution and frequency resolution by using a basis function which can extract a 1/12 octave (one musical interval).

As a further musical interval estimation method for an audio signal, a method is available wherein a BPF (Band Pass Filter) bank which includes one BPF for each musical interval of each octave is used to obtain signal components of the musical intervals of the octaves as disclosed, for example, in Japanese Patent Publication No. Sho 61-26067. However, where a BPF bank is used, it is necessary to design the BPFs so that, for example, an appropriate time resolution and frequency resolution may be obtained for each octave.

However, where the method which uses the wavelet conversion or a BPF bank is applied, for example, to analysis of musical intervals for the overall audio frequencies, a very great amount of arithmetic operation is required, and therefore, the methods are poor in practical use.

SUMMARY OF THE INVENTION

It is an object of the present invention to provide a signal processing apparatus and method, a recording medium and a program by which signal components of different musical intervals of an audio signal can be obtained with a small amount of arithmetic operation.

In order to attain the object described above, according to an aspect of the present invention, there is provided a signal processing apparatus for processing an audio signal, comprising an octave dividing section for dividing an input signal into high frequency components on a high frequency band side and low frequency components on a low frequency band side and down sampling the high frequency components and the low frequency components individually to divide the audio signal into a plurality of signals of different octaves, and a filter section for filtering the signals of the different octaves to extract a plurality of signals of different musical intervals.

According to another aspect of the present invention, there is provided a signal processing method for a signal processing apparatus which processes an audio signal, comprising an octave dividing step of dividing an input signal into high frequency components on a high frequency band side and low frequency components on a low frequency band side and down sampling the high frequency components and the low frequency components individually to divide the audio signal into a plurality of signals of different octaves, and a filter step of filtering the signals of the different octaves to extract a plurality of signals of different musical intervals.

According to a further aspect of the present invention, there is provided a recording medium on or in which a computer-readable program for causing a computer to execute processing of an audio signal is recorded, the program comprising an octave dividing step of dividing an input signal into high frequency components on a high frequency band side and low frequency components on a low frequency band side and down sampling the high frequency components and the low frequency components individually to divide the audio signal into a plurality of signals of different octaves, and a filter step of filtering the signals of the different octaves to extract a plurality of signals of different musical intervals.

According to a still further aspect of the present invention, there is provided a program for causing a computer to execute processing of an audio signal, comprising an octave dividing step of dividing an input signal into high frequency components on a high frequency band side and low frequency components on a low frequency band side and down sampling the high frequency components and the low frequency components individually to divide the audio signal into a plurality of signals of different octaves, and a filter step of filtering the signals of the different octaves to extract a plurality of signals of different musical intervals.

According to the signal processing apparatus and method, recording medium and program, an input signal is divided into high frequency components on the high frequency band side and low frequency components on the low frequency band side, and the high and low frequency components are individually down sampled to divide the audio signal into a plurality of signals of different octaves. Further, the signal of each of the octaves is filtered to extract a plurality of signals of different musical intervals.

With the signal processing apparatus and method, recording medium and program, signal components of individual musical intervals of an audio signal can be obtained with a small amount of arithmetic operation.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 14 is a view illustrating the number of times of arithmetic operation according to a related-art technique;

FIGS. 15 and 16 are views illustrating the number of times of arithmetic operation according to a technique to which the present invention is applied; and FIG. 17 is a block diagram showing an example of a configuration of a computer to which the present invention is applied.

DETAILED DESCRIPTION OF THE PREFERRED EMBODIMENT

Figure 1:
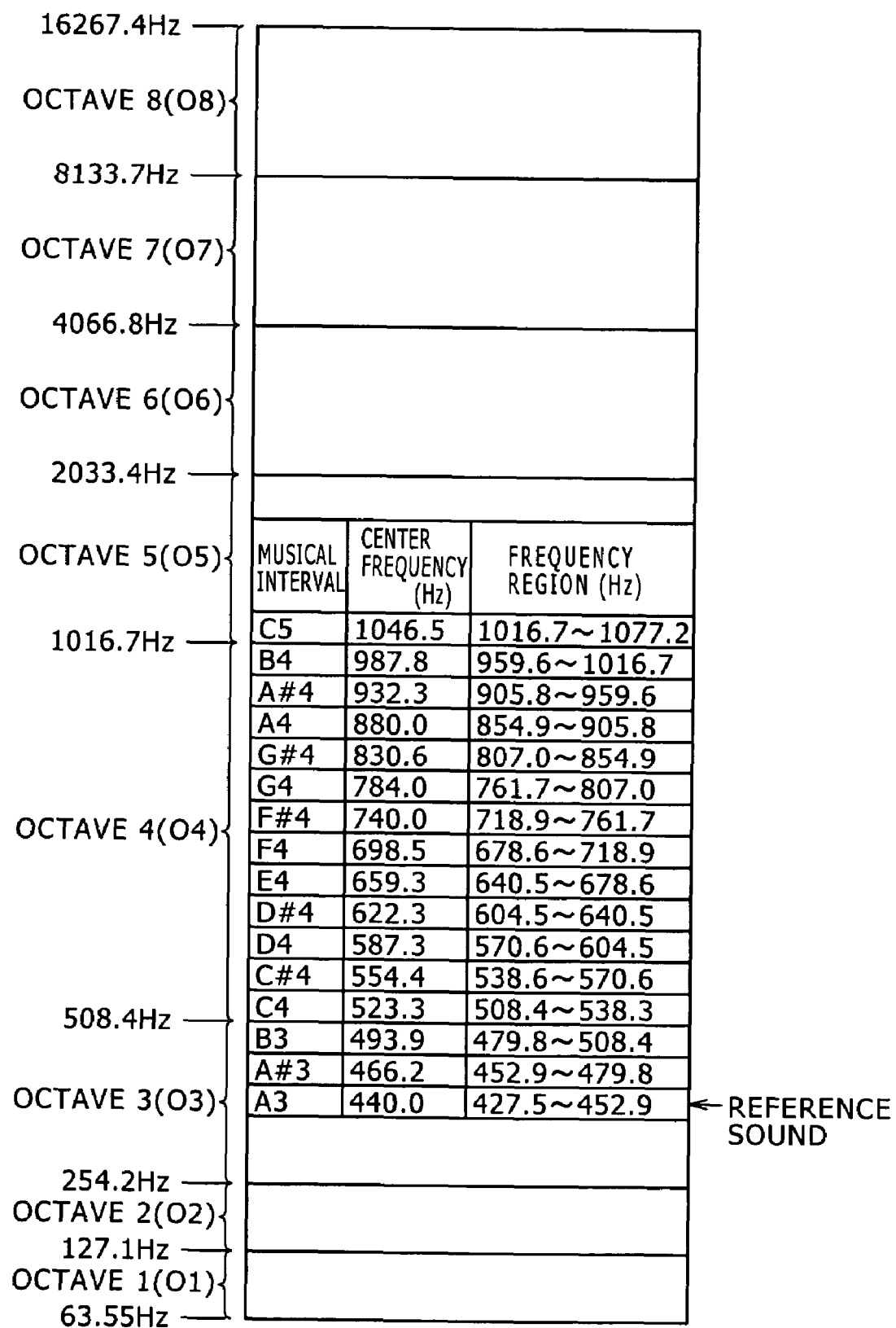
FIG. 1 is a view illustrating musical intervals and frequencies of an audio signal.

Before the best mode for carrying out the present invention is described in detail, a corresponding relationship between several features recited in the accompanying claims and particular elements of the preferred embodiment described below is described. It is to be noted, however, that, even if some mode for carrying out the invention which is recited in the specification is not described in the description of the corresponding relationship below, this does not signify that the mode for carrying out the invention is out of the scope or spirit of the present invention. On the contrary, even if some mode for carrying out the invention is described as being within the scope or spirit of the present invention in the description of the corresponding relationship below, this does not signify that the mode is not within the spirit or scope of some other invention than the present invention.

Further, the following description does not signify all of the invention disclosed in the present specification. In other words, the following description does not deny the presence of an invention which is disclosed in the specification but is not recited in the claims of the present application, that is, the description does not deny the presence of an invention which may be filed for patent in a divisional patent application or may be additionally included into the present patent application as a result of later amendment.

According to claim 1 of the present invention, there is provided a signal processing apparatus (for example, a signal processing apparatus 11 of FIG. 2) for processing an audio signal, comprising an octave dividing section (for example, an octave dividing block 22 of FIG. 2) for dividing an input signal into high frequency components on a high frequency band side and low frequency components on a low frequency band side and down sampling the high frequency components and the low frequency components individually to divide the audio signal into a plurality of signals of different octaves, and a filter section (for example, BPFBs $23_1$ to $23_8$ of FIG. 2) for filtering the signals of the different octaves to extract a plurality of signals of different musical intervals.

The signal processing apparatus according to claim 2 may further comprise a re-sampling section (for example, a re-sampling section 21 of FIG. 2) for re-sampling the audio signal.

In the signal processing apparatus according to claim 4, the filter section may include 12 band-pass filters (for example, BPFs $101_1$ to $101_{12}$ of FIG. 7) having pass bands for audio signals of frequency ranges of 12 musical intervals.

According to claim 5 of the present invention, there is provided a signal processing method for a signal processing apparatus which processes an audio signal, comprising an octave dividing step (for example, a process at step S2 of FIG. 10) of dividing an input signal into high frequency components on a high frequency band side and low frequency components on a low frequency band side and down sampling the high frequency components and the low frequency components individually to divide the audio signal into a plurality of signals of different octaves, and a filter step (for example, a process at step S3 of FIG. 10) of filtering the signals of the different octaves to extract a plurality of signals of different musical intervals.

Also a program of a recording medium and a program according to claims 6 and 7 of the present invention individually comprise particular steps similar to those of the signal processing method according to claim 5.

In the following, a preferred embodiment of the present invention is described with reference to the accompanying drawings.

First, a relationship between musical intervals and frequencies is described with reference to FIG. 1.

In FIG. 1, it can be seen that frequencies within a range from 63.55 Hz to 16,267.4 Hz are divided into 8 octaves from the octave 1 to octave 8 (hereinafter referred to also as O1 to O8). Each octave includes 12 musical intervals (sounds) of C (do), C#, D (re), D#, E (mi), F (fa), F#, G (so), G#, A (la), A# and B (ti) in an ascending order of the frequency. The 12 musical intervals of C, C#, D, D#, E, F, F#, G, G#, A, A# and B of the octave 1 (O1) are hereinafter referred to as C1, C#1, D1, D#1, E1, F1, F#1, G1, G#1, A1, A#1 and B1, respectively, and the 12 musical intervals of C, C#, D, D#, E, F, F#, G, G#, A, A# and B of the octave 2 (O2) are hereinafter referred to as C2, C#2, D2, D#2, E2, F2, F#2, G2, G#2, A2, A#2 and B2, respectively. This similarly applies to the octaves 3 (O3) to 8 (O8).

In FIG. 1, the frequencies of the 12 musical intervals of each of the octaves 1 to 8 are determined in the following manner, for example, using A3 (la) of the octave 3 as a reference sound having a frequency (center frequency) of 440 Hz.

Since the musical intervals are distributed logarithmically with respect to the frequency as described hereinabove, where one octave is classified into 12 sounds, the ratio in frequency (ratio in center frequency) between adjacent musical intervals is $1:\sqrt[12]{2}$ (the twelfth root of 2). Also the ratio in frequency region between adjacent musical intervals is $1:\sqrt[12]{2}$ (the twelfth root of 2).

For example, the frequency (center frequency) of the musical interval A#3 higher by one musical interval than the musical interval of A3 of the octave 3 is 466.2 Hz which is equal to $\sqrt[12]{2}$ times the frequency 440.0 of A3, and the frequency of the musical interval B3 higher by one musical interval than the musical interval of A#3 is 493.9 Hz which is equal to $\sqrt[12]{2}$ times that of A#3. For example, the frequencies of the musical intervals of A3 of the octave 3 to C5 of the octave 5 illustrated in FIG. 1 are determined similarly.

Since a set of every 12 musical intervals from a musical interval of C (do) to another musical interval of B (ti) is defined as one octave, the frequency range of the octave 4 is from the lowest frequency of the frequency range of C4 to the highest frequency of the frequency range of B4 (lowest frequency of the frequency range of the octave 5), that is, from 508.6 Hz to 1,016.7 Hz. It is to be noted that the term from fa [Hz] to fb [Hz] regarding the frequency represents "equal to or higher than fa [Hz] but lower than fb [Hz]".

Further, the center frequency and the frequency range of C5 of the octave 5 which is higher by one octave than C4 of the octave 4 are 1,046.5 Hz and 1,016.7 Hz to 1,077.2 Hz which are equal to twice those, respectively. Also with regard to the other octaves of the octave 1 to octave 8, the frequency range of the octave and the center frequency and the frequency range of each of the 12 musical intervals in the octave are determined similarly. The value of the frequency at each of the boundaries between octaves such as 508.4 Hz and 1,016.7 Hz in FIG. 1 is hereinafter referred to as frequency (boundary frequency) on a boundary of an octave or between octaves.

It is to be noted that, in FIG. 1, illustration of the center frequencies and the frequency ranges of the 12 musical intervals of the octaves 1 to 8 is omitted except the octave 4 and some musical intervals of the octaves 3 and 5.

Figure 2:
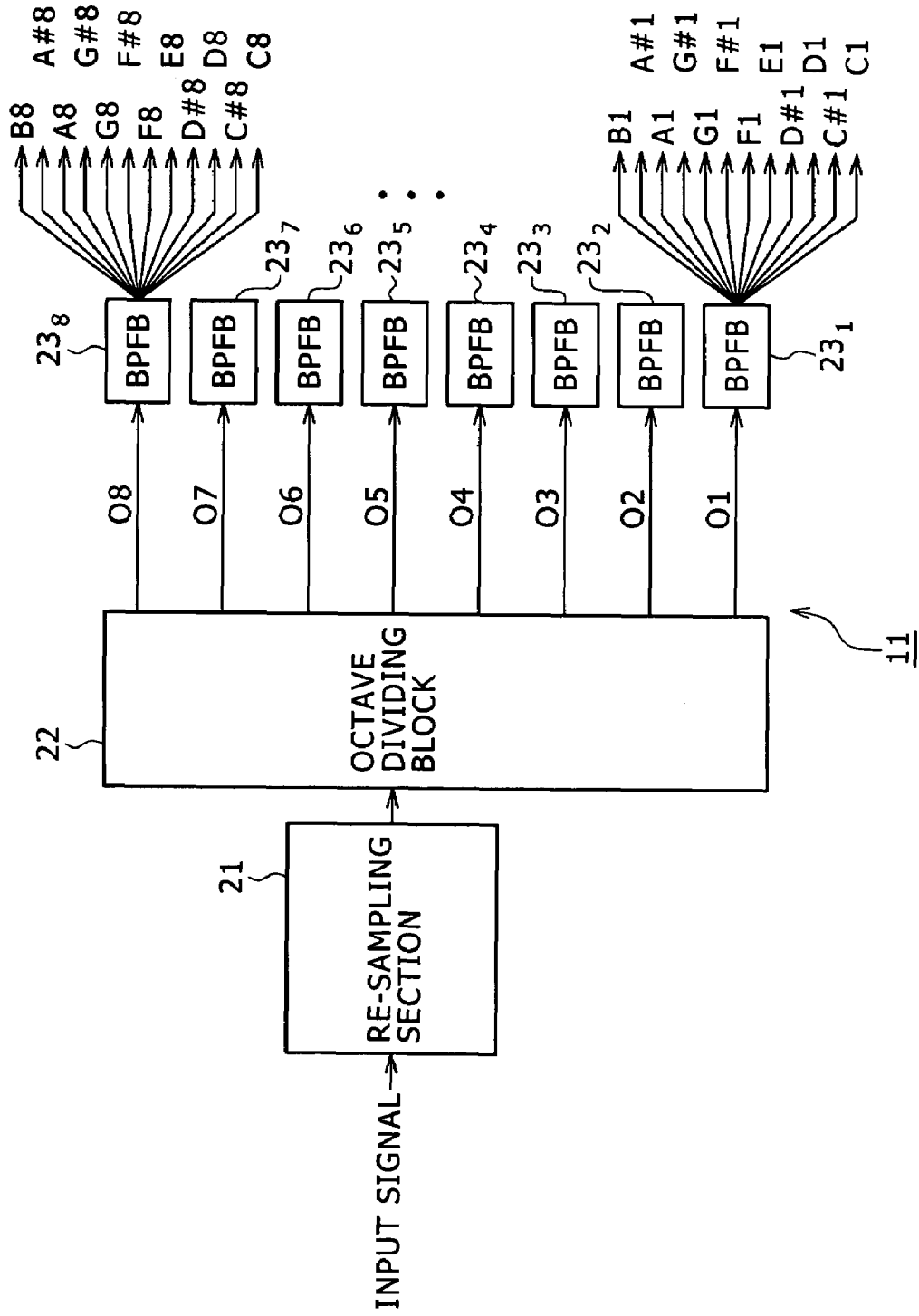
FIG. 2 is a block diagram showing an example of a configuration of a signal processing apparatus to which the present invention is applied.

FIG. 2 shows an example of a configuration of a signal processing apparatus 11 to which the present invention is applied.

The signal processing apparatus 11 includes a re-sampling section 21, an octave dividing block 22, and BPFBs $23_1$ to $23_8$.

An audio signal (input signal) inputted to the signal processing apparatus 11 is an audio signal produced by sampling with a predetermined sampling rate. Here, it is assumed that the input signal is, for example a signal reproduced from a CD (Compact Disk), and the sampling frequency of the input signal is 44.1 kHz.

The re-sampling section 21 re-samples the inputted audio signal with a desired sampling frequency different from the sampling frequency of 44.1 kHz of the audio signal. Then, the re-sampling section 21 outputs the audio signal re-sampled with the desired sampling frequency to the octave dividing block 22.

The sampling frequency of the re-sampling performed by the re-sampling section 21 is determined in the following manner.

The octave dividing block 22 at the stage succeeding the re-sampling section 21 divides an input signal inputted thereto into two components of high frequency components and low frequency components as hereinafter described. Then, the octave dividing block 22 down samples the high and low frequency components individually with a sampling frequency equal to one half the sampling frequency of the input signal. Then, a result of the sampling of the high frequency components is extracted as a signal of one octave.

On the other hand, a result of the down sampling of the low frequency components is further divided into two frequency components of high frequency components and low frequency components and down sampled to ½. Then, a result of the down sampling of the high frequency components is extracted as a signal of an octave lower by the octave extracted in the preceding cycle. Thereafter, the octave dividing block 22 extracts a plurality of signals of different octaves similarly.

Since the octave dividing block 22 repeats frequency band division into high frequency components and low frequency components and ½ down sampling to extract signals of octaves in this manner, a value obtained by dividing the sampling frequency of the audio signal inputted to the octave dividing block 22 by $2^n$ (n=1, 2, . . . ) makes a boundary frequency of an octave. If it is assumed that an audio signal inputted is not re-sampled with a desired sampling frequency by the re-sampling section 21 and consequently is inputted to the octave dividing block 22 while it keeps the sampling frequency of 44.1 kHz, then since the audio signal is frequency band divided by the octave dividing block 22, a signal of a frequency range of 44.1 kHz/2 to (44.1 kHz/2)/2 is obtained. In this instance, the lowest frequency and the highest frequency of the high frequency components do not coincide with any of the boundary frequencies of the octaves 1 to 8 illustrated in FIG. 1. As a result, the low frequency band side or the high frequency band side of the high frequency components exhibits lack of some frequency components of a signal of musical intervals of a desired octave or exhibits containment of some frequency components of a signal of musical intervals of another octave adjacent a desired octave. Consequently, a process of extracting signals of different musical intervals is complicated.

Therefore, the re-sampling section 21 re-samples the original audio signal with a sampling frequency equal to a power-of two times a boundary frequency so that the lowest frequency and the highest frequency of high frequency components obtained for each repetition of frequency band division and down sampling of the signal may coincide with the highest frequency and the lowest frequency of certain octaves at the octave dividing block 22 at the stage succeeding the re-sampling section 21.

In the present embodiment, the re-sampling section 21 re-samples the audio signal, for example, with a sampling frequency of $2^5$ times of 1,016.7 Hz which is the boundary frequency between the octaves 4 and 5, that is, with the sampling frequency of 32,534.7 Hz. It is to be noted that what value should be adopted as a sampling frequency of a power-of two times a boundary frequency of an octave is determined, for example, depending upon a musical interval of what height an octave to be extracted should include.

The octave dividing block 22 divides the audio signal outputted from the re-sampling section 21 into signal components (audio signals) of the octaves 1 to 8. Then, the octave dividing block 22 outputs the audio signals of the octaves i (i=integer from 1 to 8) to the BPFBs $23_i$. In particular, the octave dividing block 22 outputs the audio signals of the octave 1 to the BPFB $23_1$, outputs the audio signals of the octave 2 to the BPFB $23_2$ and similarly outputs the audio signals of the octaves 3 to 8 to the BPFBs $23_3$ to $23_8$, respectively.

Each of the BPFBs $23_i$ has 12 BPFs (Band Pass Filters) having pass bands for audio signals of frequency ranges of the 12 musical intervals of C, C#, D, D#, E, F, F#, G, G#, A, A# and B. Thus, each of the BPFBs $23_i$ filters audio signals of the octave i inputted thereto from the octave dividing block 22 to extract 12 audio signals of different musical intervals.

In other words, the BPFB $23_i$ extracts audio signals of 12 musical intervals of the octave i by means of the 12 BPFs. For example, the BPFB $23_1$ extracts signal components of the musical intervals of C1, C#1, D1, D#1, E1, F1, F#1, G1, G#1, A1, A#1 and B1 as seen in FIG. 2. Similarly, for example, the BPFB $23_8$ extracts signal components of the musical intervals of C8, C#8, D8, D#8, E8, F8, F#8, G8, G#8, A8, A#8 and B8.

In the signal processing apparatus 11 of FIG. 2 having such a configuration as described above, the re-sampling section 21 re-samples an audio signal, and the octave dividing block 22 divides the audio signal into signals of the octaves 1 to 8. Further, the BPFBs $23_1$ to $23_8$ individually extract and output signals of 12 musical intervals from the signals of the octaves 1 to 8.

Figure 3:
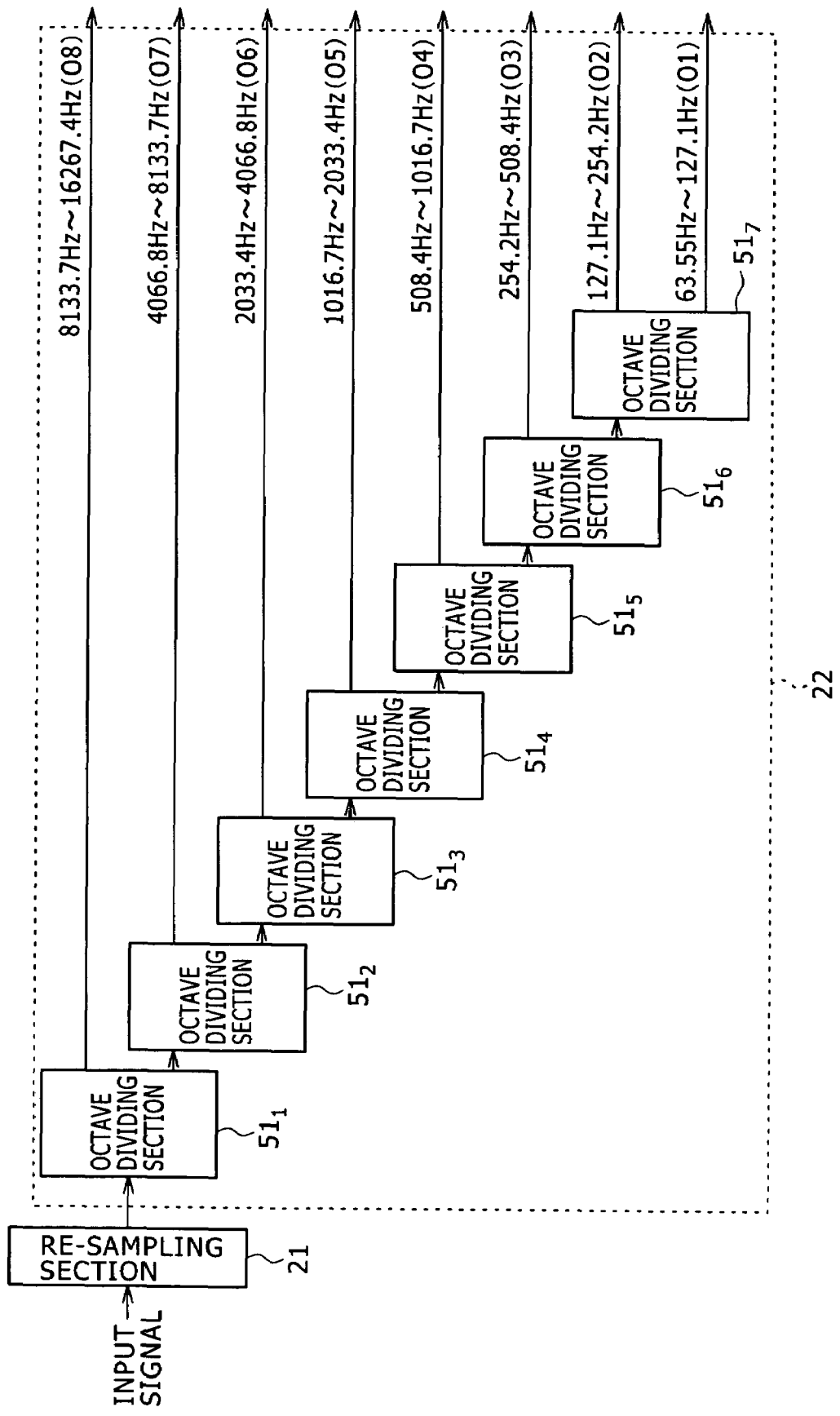
FIG. 3 is a block diagram showing an example of a detailed configuration of an octave dividing block shown in FIG. 2.

FIG. 3 shows in block diagram an example of a detailed configuration of the octave dividing block 22 shown in FIG. 2.

Referring to FIG. 3, the octave dividing block 22 includes seven octave dividing sections $51_1$ to $51_7$. The seven octave dividing sections $51_1$ to $51_7$ perform basically similar processing.

Each of the octave dividing sections $51_j$ (j=1, 2, ..., 6, 7) divides the audio signal inputted thereto into high frequency components on the high frequency side and low frequency components on the low frequency side. Further, each of the octave dividing sections $51_j$ performs down sampling of reducing the sample number of each of audio signals of high frequency components (hereinafter referred to as high frequency band audio signals) and audio signals of low frequency components (hereinafter referred to as low frequency band audio signal) to ½.

Further, each of the octave dividing sections $51_j$ outputs high frequency band audio signals after the down sampling as audio signals of the octave [9−j] to the BPFB $23_{9−j}$ (FIG. 2). Further, the octave dividing section $51_j$ outputs low frequency band audio signals after the down sampling to the octave dividing section $51_{j+1}$. However, where j=7, the octave dividing section $51_7$ outputs low frequency band audio signals after the down sampling as audio signals of the octave 1 to the BPFB $23_1$ (FIG. 2).

Now, processing of the octave dividing section $51_j$ is described.

An audio signal re-sampled with the sampling frequency of 32,534.7 Hz and inputted from the re-sampling section 21 is inputted to the octave dividing section $51_1$. The octave dividing section $51_1$ frequency band divides the inputted audio signal so as to divide the frequency band of the same into two frequency bands. In particular, where the sampling frequency of the audio signal inputted to the octave dividing section $51_1$ is represented by $f_s$, the octave dividing section $51_1$ divides the audio signal into high frequency components on the high frequency side from $f_s/2$ to $(f_s/2)/2$ and low frequency components on the low frequency side from 0 to $(f_s/2)/2$. Further, the octave dividing section $51_1$ down samples the audio signals of the high frequency components and the audio signals of the low frequency components obtained by the frequency division to ½, for example, by sampling out the samples.

Then, the octave dividing section $51_1$ outputs the audio signals of the high frequency components after the down sampling as audio signals of an octave to the BPFB $23_{8(=9−1)}$ (FIG. 2). Further, the octave dividing section $51_1$ outputs the audio signals of the low frequency components after the down sampling to the octave dividing section $51_{2(=1+1)}$.

Also the octave dividing sections $51_2$ to $51_7$ perform similar processing to that of the octave dividing section $51_1$ for audio signals supplied thereto from the octave dividing sections $51_1$ to $51_6$ at the preceding stage, respectively. However, the octave dividing section $51_7$ further frequency band divides audio signals of the low frequency components after the down sampling and down samples resulting audio signals of high frequency components to ½. Then, the octave dividing section $51_7$ outputs audio signals of high frequency components after the down sampling to the BPFB $23_1$ (FIG. 2).

The octave dividing block 22 performs such processing as described above, and consequently, audio signals of the frequency range of the octave 8 (O8) from within the original audio signal, that is, of the frequency range from 8,133.7 Hz to 16,267.4 Hz, are outputted from the octave dividing section $51_1$ to the BPFB $23_8$ (FIG. 2).

Similarly, audio signals of the octave 7 (O7) of the frequency range of 4,066.8 Hz to 8,133.7 Hz are outputted to the BPFB $23_7$; audio signals of the octave 6 (O6) of the frequency range of 2,033.4 Hz to 4,066.8 Hz are outputted to the BPFB $23_6$; audio signals of the octave 5 (O5) of the frequency range of 1,016.7 Hz to 2,033.4 Hz are outputted to the BPFB $23_5$; audio signals of the octave 4 (O4) of the frequency range of 508.4 Hz to 1,016.7 Hz are outputted to the BPFB $23_4$; audio signals of the octave 3 (O3) of the frequency range of 254.2 Hz to 508.4 Hz are outputted to the BPFB $23_3$; audio signals of the octave 2 (O2) of the frequency range of 127.1 Hz to 254.2 Hz are outputted to the BPFB $23_2$; and audio signals of the octave 1 (O1) of the frequency range of 63.55 Hz to 127.1 Hz are outputted to the BPFB $23_1$.

In short, the octave dividing block 22 repeats division of the input signal into high frequency components on the high frequency side and low frequency components on the low frequency side and down sampling of the high frequency components and the low frequency components thereby to divide the audio signal into signals of eight octaves.

Accordingly, the octave dividing block 22 can extract 8 octaves of the octaves 1 to 8 corresponding to a logarithmic distribution of frequencies of musical intervals. In other words, the octave dividing block 22 can extract audio signals of each octave with a time-base resolution and a frequency resolution which increase in proportion to the amount of information which the octave has.

Figure 4:
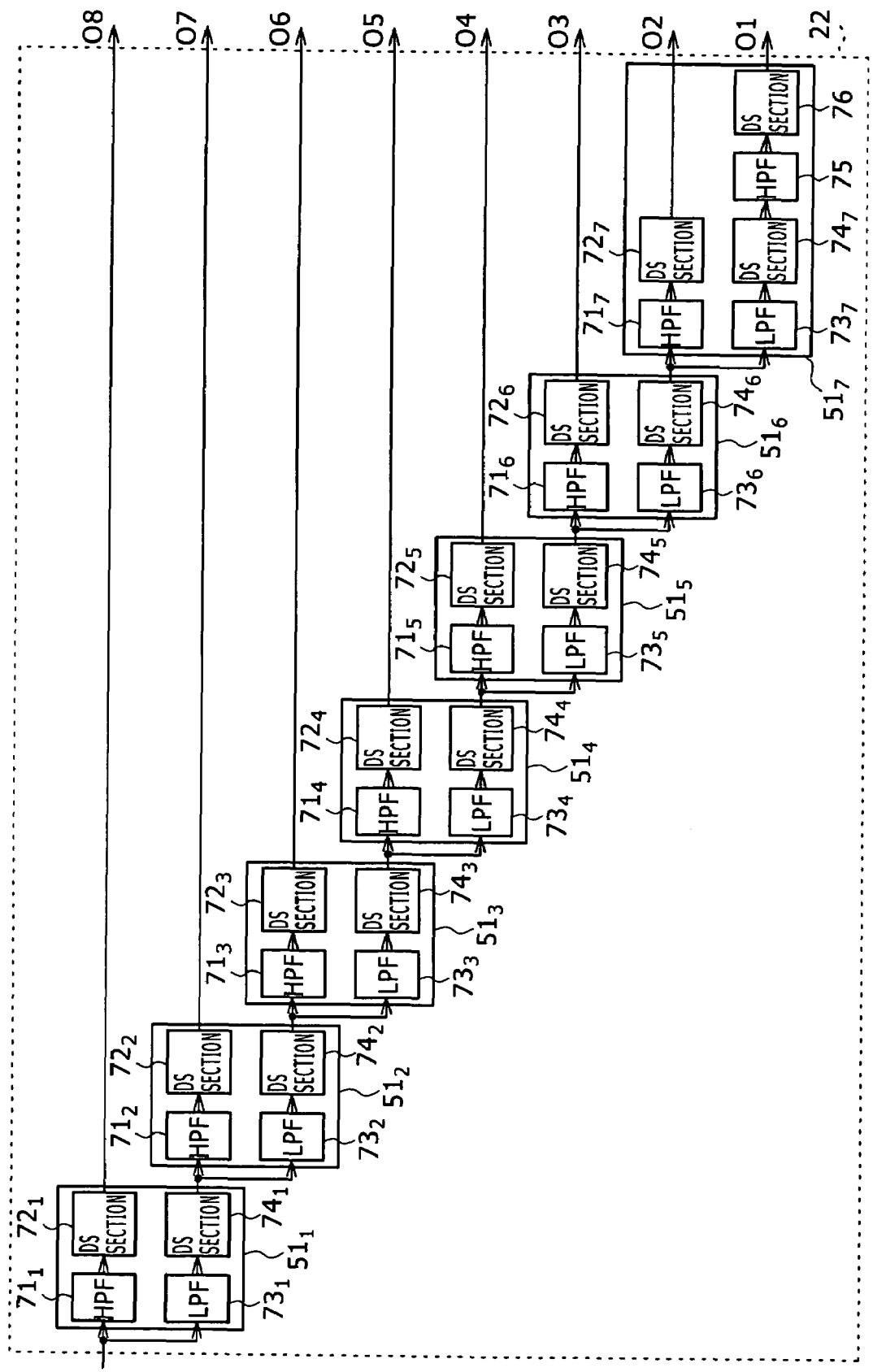
FIG. 4 is a block diagram showing an example of a detailed configuration of an octave dividing section shown in FIG. 3.

FIG. 4 shows an example of a detailed configuration of the octave dividing sections $51_1$ to $51_7$ of FIG. 3.

Each of the octave dividing sections $51_j$ (j=1, 2, . . . , 6, 7) includes an HPF (High Pass Filter) $71_j$, a DS (Down Sampling) section $72_j$, an LPF (Low Pass Filter) $73_j$ and another DS section $74_j$. It is to be noted, however, that the octave dividing section $51_7$ further includes an HPF 75 and a DS section 76.

Audio signals are inputted to the HPF $71_j$ and the LPF $73_j$ of the octave dividing section $51_j$ from the preceding stage to the octave dividing section $51_j$. The HPF $71_j$ and the LPF $73_j$ frequency band divide the audio signals inputted thereto.

In particular, the HPF $71_j$ extracts, from among the audio signals inputted thereto, high frequency band audio signals having frequencies higher than a frequency equal to ½ the frequency band of the inputted audio signals, and outputs the extracted high frequency band audio signals to the DS section $72_j$. Meanwhile, the LPF $73_j$ extracts, from among the audio signals inputted thereto, low frequency band audio signals having frequencies lower than the frequency equal to ½ the frequency band of the inputted audio signals, and outputs the extracted low frequency band audio signals to the DS section $74_j$.

Each of the DS sections $72_j$ and $74_j$ down samples the audio signals inputted from the HPF $71_j$ or LPF $73_j$ with a sampling frequency equal to one half the sampling frequency of the inputted audio signals.

The DS section $72_j$ outputs the audio signals after the down sampling as audio signals of the octave [9−j] to the BPFB $23_{9-j}$ (FIG. 2). The DS section $74_j$ outputs the audio signals after the down sampling to the HPF $71_{j+1}$ and the LPF $73_{j+1}$ of the octave dividing section $51_{j+1}$ at the succeeding stage. It is to be noted, however, that the DS section $74_7$ in the octave dividing section $51_7$ outputs audio signals after the down sampling to the HPF 75. Then, the HPF 75 extracts, from among the audio signals after the down sampling from the DS section $74_7$, high frequency band audio signals having frequencies higher than a frequency equal to one half the frequency band of the audio signals and outputs the extracted high frequency band audio signals to the DS section 76. The DS section 76 down samples the audio signals from the HPF 75 with a sampling frequency equal to one half the sampling frequency of the audio signals and outputs the down sampled audio signals as audio signals of the octave 1 to the BPFB $23_1$ (FIG. 2).

Figure 5:
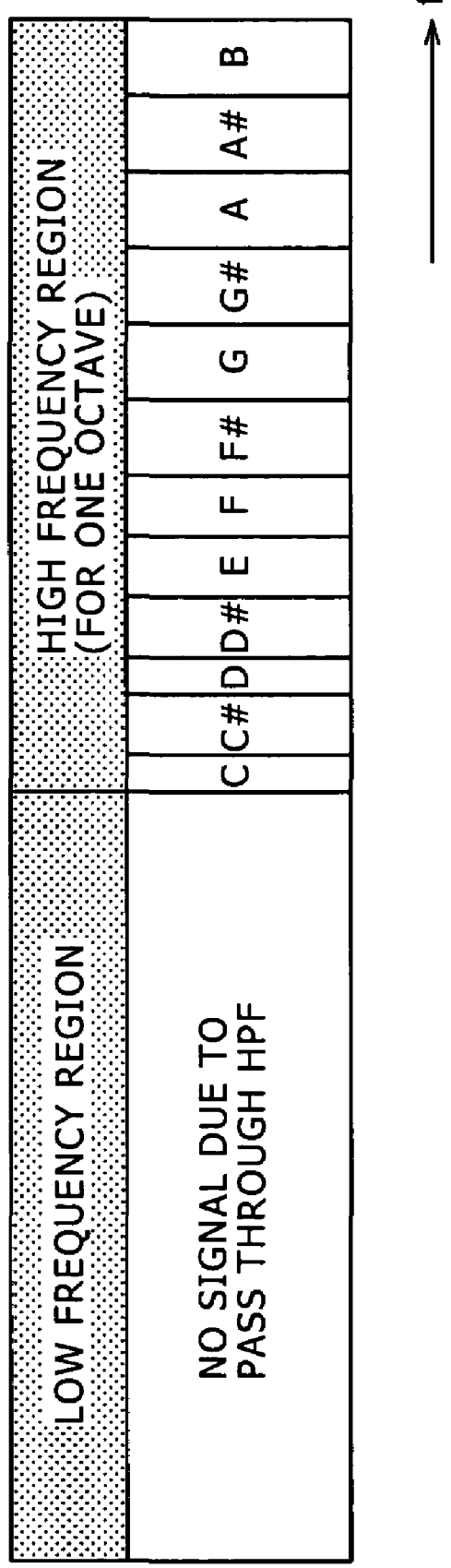
FIGS. 5 and 6 are views illustrating a concept of a result of a process of an audio signal.
Figure 6:
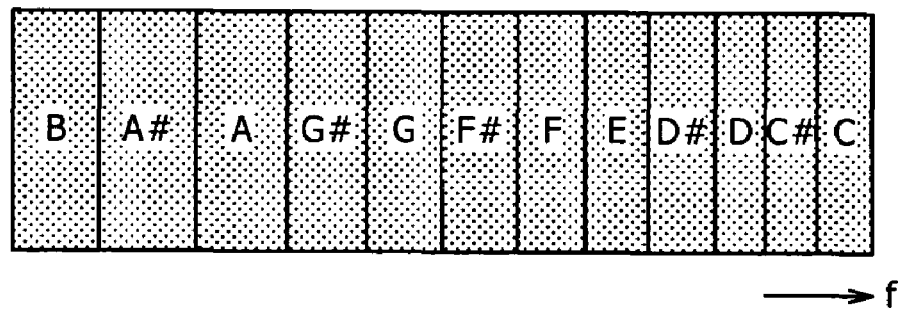

FIGS. 5 and 6 illustrate a concept of a result of processing of audio signals by the HPFs $71_j$ and the DS sections $72_j$ (j=1, 2, . . . , 6, 7) shown in FIG. 4.

Each of the HPFs $71_j$ extracts (passes therethrough) audio signals of high frequency components on the high frequency band side from between frequency components on the high frequency band side and frequency components on the low frequency band side from among audio signals inputted thereto as audio signals of one octave. The audio signals of the one octave are audio signals of the octave [9−j] and includes the 12 musical intervals of C, C#, D, D#, E, F, F#, G, G#, A, A# and B as seen in FIG. 5.

Then, the audio signals of the high frequency components of FIG. 5 having passed through the HPF $71_j$ are down sampled with a sample frequency of ½ by the DS section $72_j$.

FIG. 6 illustrates audio signals for one octave after the down sampling by the DS section $72_j$. The audio signals of the high frequency components of FIG. 5 appear reciprocally on the low frequency side by down sampling by the DS section $72_j$. Accordingly, in the audio signals of the high frequency components after the down sampling, the list of signal components of musical intervals on the frequency axis is reverse to the list of C, C#, D, D#, E, F, F#, G, G#, A, A# and B before the down sampling as seen in FIG. 6. In other words, the high-low list of the musical interval is reverse.

Figure 7:
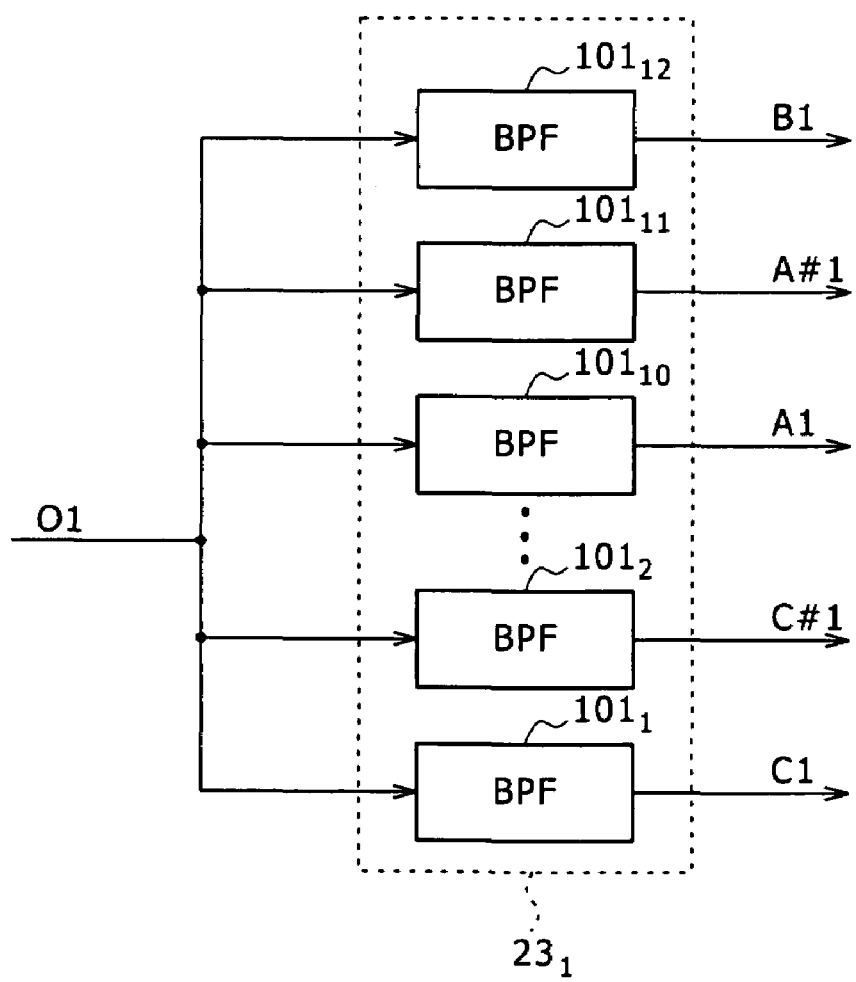
FIG. 7 is a block diagram showing an example of a detailed configuration of a BPF bank shown in FIG. 2.

Now, an example of a detailed configuration of the BPFBs $23_1$ to $23_8$ is described. The BPFBs $23_1$ to $23_8$ have a similar configuration, and FIG. 7 shows an example of a detailed configuration only of the BPFB $23_1$.

The BPFB $23_1$ includes 12 BPFs $101_1$ to $101_{12}$ having pass bands corresponding to frequency ranges of the 12 musical intervals of C1, C#1, D1, D#1, E1, F1, F#1, G1, G#1, A1, A#1 and B1, respectively.

In particular, the BPF $101_1$ extracts, from audio signals of the octave 1 inputted from the octave dividing block 22 (FIG. 3), the audio signal of the musical interval of C1 and outputs the audio signal.

The BPF $101_2$ extracts, from the audio signals of the octave 1, the audio signal of the musical interval of C#1 and outputs the audio signal. Similarly, the BPFs $101_3$ to $101_{12}$ extract the audio signals of the musical intervals of D1, D#1, E1, F1, F#1, G1, G#1, A1, A#1 and B1 and outputs the extracted audio signals, respectively.

Processing of the BPFB $23_1$ of FIG. 7 is described with reference to FIGS. 8 and 9. FIGS. 8 and 9 illustrate a concept of the processing of the BPFB $23_1$.

Figure 8A:
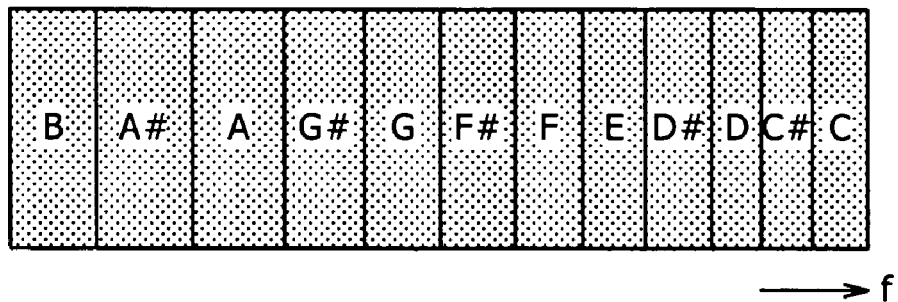
FIGS. 8A and 8B, and 9 are views illustrating a concept of a process of the BPF bank of FIG. 7.
Figure 9:
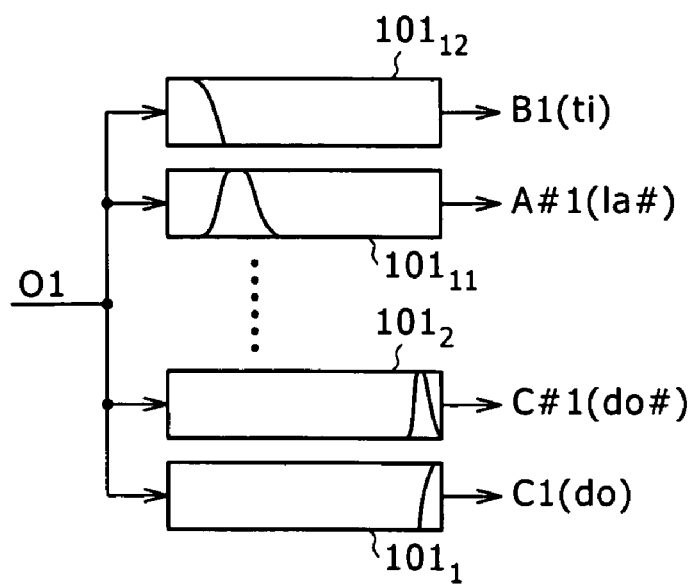

FIG. 8A illustrates frequency components of audio signals of the octave 1 supplied from the octave dividing block 22 to the BPFB $23_1$. As described hereinabove with reference to FIG. 6, the audio signals of the octave 1 outputted from the octave dividing block 22 have a list of musical intervals on the frequency axis which is reverse in the high-low direction.

Figure 8B:
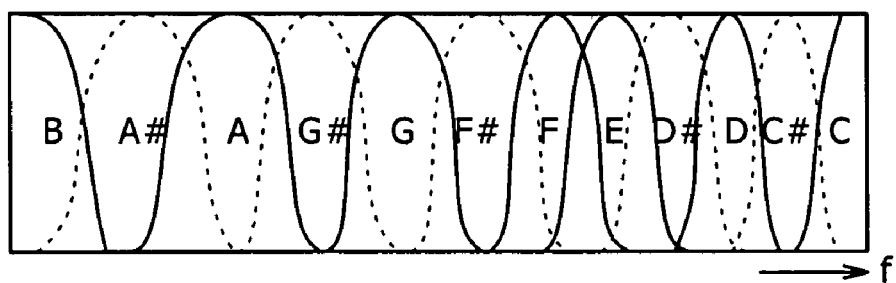

Therefore, the BPFs $101_1$ to $101_{12}$ of FIG. 7 have such filter characteristics as illustrated in FIG. 8B. In particular, the BPFs $101_1$ to $101_{12}$ of FIG. 7 are formed as filters which pass therethrough the frequency components of the frequency ranges of C1, C#1, D1, D#1, E1, F1, F#1, G1, G#1, A1, A#1 and B1 whose list is reverse in the high-low direction, respectively.

In particular, the BPF $101_1$ extracts, from among the audio signals of the octave 1 outputted from the octave dividing block 22, a signal of the highest frequency band to obtain a frequency component of C1 of the lowest musical interval. The BPF $101_1$ extracts, from among the audio signals of the octave 1 outputted from the octave dividing block 22, a signal of the second highest frequency band to obtain a frequency component of C#1 of the second lowest musical interval. Similarly, the BPF $101_1$ extracts, from among the audio signals of the octave 1 outputted from the octave dividing block 22, signals of the successively lower frequency bands until a signal of the lowest frequency band is extracted to obtain a frequency component of B1 of the highest musical interval.

In FIG. 9, the BPFs $101_3$ to $101_{12}$ having filter characteristics shown in FIG. 8B are illustrated in a corresponding relationship to the block diagram of FIG. 7.

It is to be noted that the path bands of the BPFBs $23_k$ (k=1, 2, . . . , 12) corresponding to the BPFBs $23_1$ to $23_8$ are different from each other. In particular, the BPFs $101_k$ of the BPFB $23_i$ which processes audio signals of the octave i and the BPFs $101_k$ of the BPFB $23_{i+1}$ which processes audio signals of the octave [i+1] have path bands which are different by twice. In short, the path band of each of the BPFs $101_k$ of the BPFB $23_{i+1}$ is twice that of a corresponding one of the BPFs $101_k$ of the BPFB $23_i$.

Figure 10:
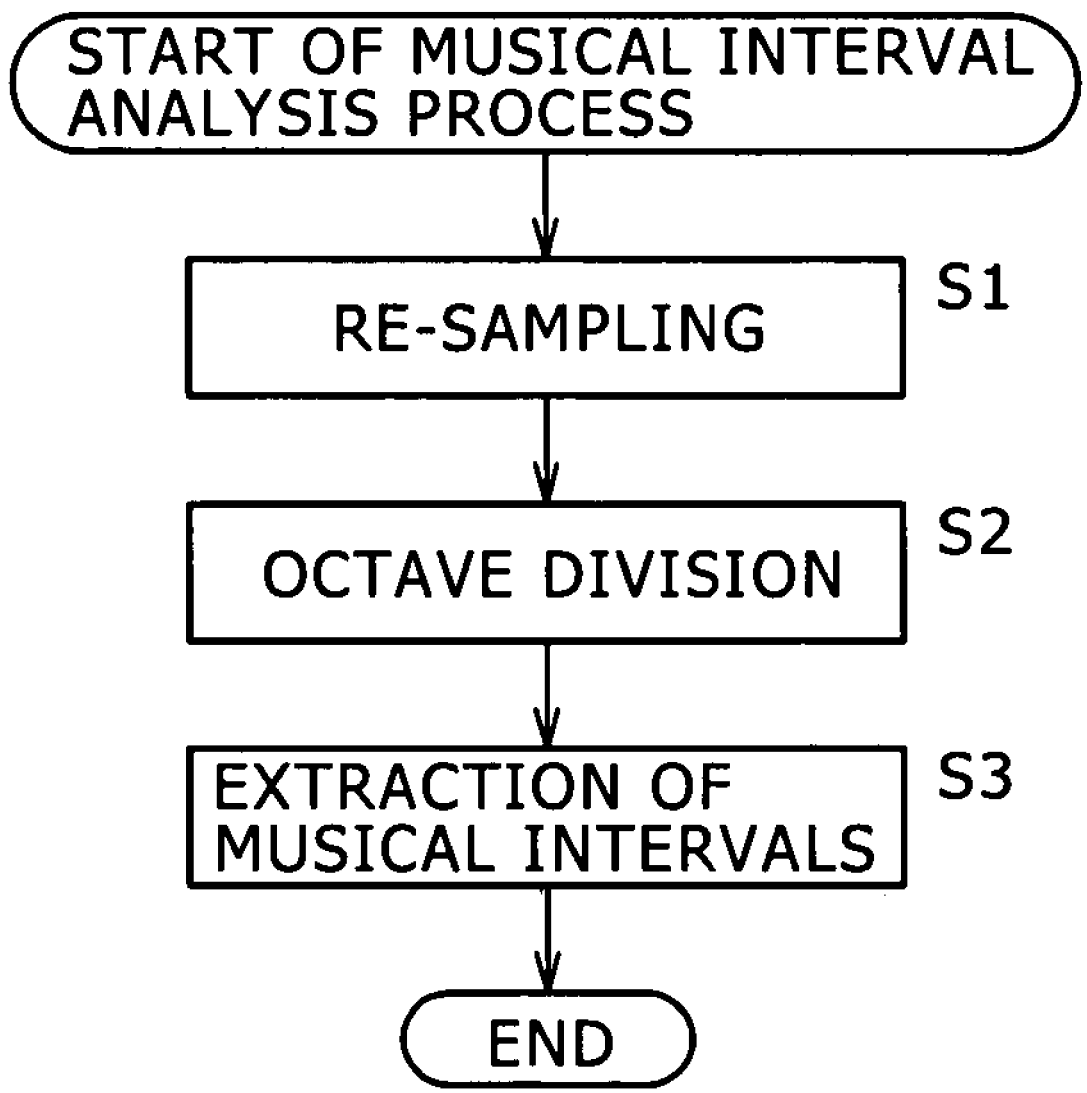
FIG. 10 is a flow chart illustrating a musical interval analysis process of the signal processing apparatus of FIG. 2.

Now, a musical interval analysis process of the signal processing apparatus 11 of FIG. 2 is described with reference to a flow chart of FIG. 10. The musical interval analysis process of FIG. 10 is started, for example, when an audio signal is inputted to the signal processing apparatus 11 of FIG. 2.

First at step S1, the re-sampling section 21 re-samples the audio signal inputted thereto with a desired sampling frequency (in the present embodiment, 32,534.7 Hz). Then the re-sampling section 21 outputs the audio signal re-sampled with the desired sampling frequency to the octave dividing block 22, and thereafter, the processing advances to step S2.

At step S2, the octave dividing block 22 divides the audio signal outputted from the re-sampling section 21 into audio signals of the octaves 1 to 8. Then, the octave dividing block 22 outputs the audio signals of the octaves i (i=inter of 1 to 8) to the BPFBs $23_i$. Thereafter, the processing advances to step S3.

At step S3, each of the BPFBs $23_i$ extracts, from the audio signal of the octave i inputted from the octave dividing block 22, the audio signals of the 12 musical intervals by means of 12 BPFs (Band Pass Filters) which have pass bands for audio signals within the frequency ranges of the 12 musical intervals of C, C#, D, D#, E, F, F#, G, G#, A, A# and B. Thereafter, the processing is ended.

Figure 11:
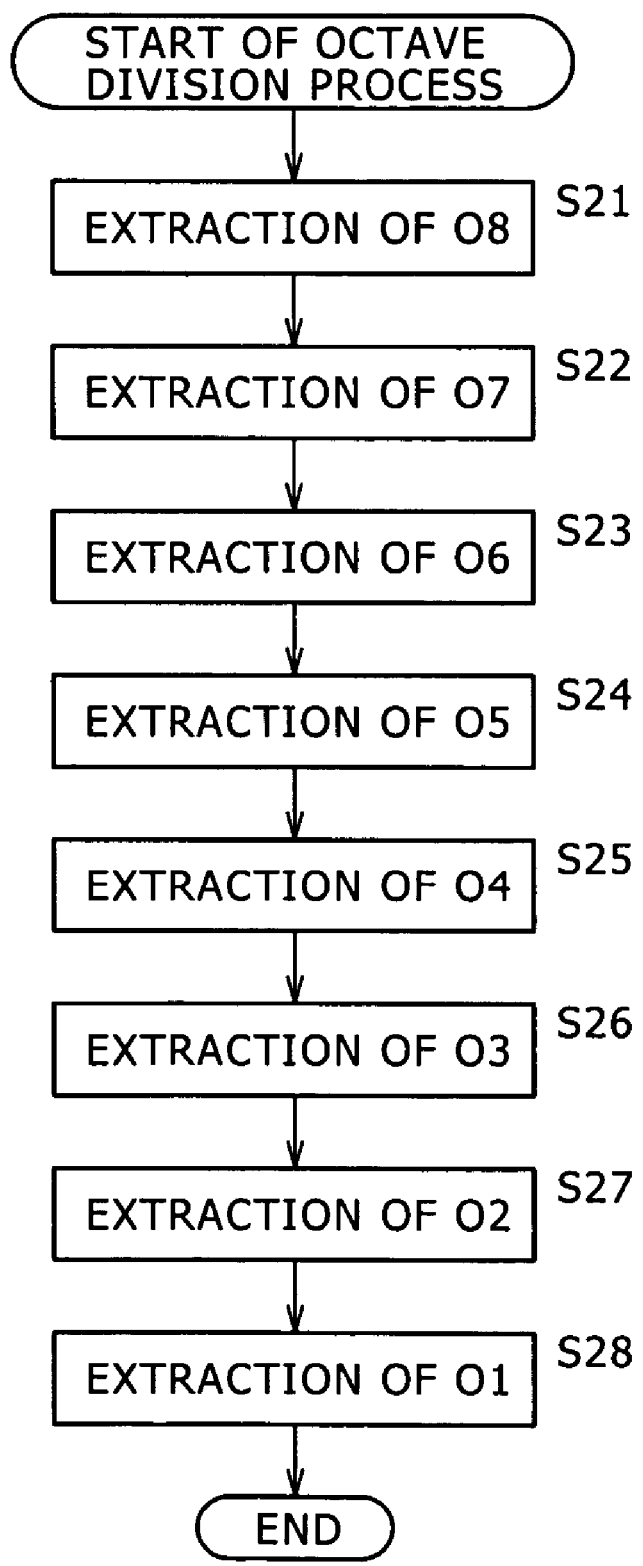
FIG. 11 is a flow chart illustrating an octave dividing process illustrated in FIG. 10.

Now, the octave dividing process of the octave dividing block 22 of FIG. 3 is described with reference to a flow chart of FIG. 11. It is to be noted that the octave dividing process corresponds to the process at step S2 of FIG. 10.

First at step S21, the octave dividing section $51_1$ divides audio signals inputted thereto from the re-sampling section 21 into audio signals of a high frequency region and audio signals of a low frequency region. Further, the octave dividing section $51_1$ performs down sampling of reducing the sample numbers of the audio signals in the high frequency region and the audio signals in the low frequency region individually to one half. Further, at step S21, the octave dividing section $51_1$ outputs the audio signals in the high frequency region after the down sampling as audio signals of the octave 8 (O8) to the BPFB $23_1$ (FIG. 2) and outputs the audio signals in the low frequency region after the down sampling to the octave dividing section $51_2$. Thereafter, the processing advances to step S22.

At each of steps S22 to S26, the octave dividing section $51_j$ (j=2, ..., 6) divides audio signals inputted thereto (audio signals of low frequency components obtained by frequency division by the octave dividing section $51_{j-1}$ at the preceding stage) into audio signals in a high frequency region and audio signals in a low frequency region. Further, the octave dividing section $51_j$ performs down sampling of reducing the sample numbers of the audio signals in the high frequency region and the audio signals in the low frequency region individually to one half. Further, the octave dividing section $51_j$ outputs the audio signals in the high frequency region after the down sampling as audio signals of the octave [9−j] to the BPFB $23_{9-j}$ (FIG. 2) and outputs the audio signals in the low frequency region after the down sampling to the octave dividing section $51_{j+1}$.

After step S26, the processing advances to step S27, at which the octave dividing section $51_7$ divides audio signals inputted thereto from the octave dividing section $51_6$ into audio signals in a high frequency region and audio signals in a low frequency region. Further, the octave dividing section $51_7$ performs down sampling of reducing the sample numbers of the audio signals in the high frequency region and the audio signals in the low frequency region individually to one half. Further, the octave dividing section $51_7$ outputs the audio signals in the high frequency region after the down sampling as audio signals of the octave 2 to the BPFB $23_2$ (FIG. 2). Thereafter, the processing advance to step S28.

At step S28, the octave dividing section $51_7$ further frequency band divides the audio signals of low frequency components after the down sampling and down samples audio signals of high frequency components obtained by the frequency division to one half. Further, the octave dividing section $51_7$ outputs the audio signals of the high frequency components after the down sampling as audio signals of the octave 1 to the BPFB $23_1$ (FIG. 2). Thereafter, the processing is ended.

Figure 12:
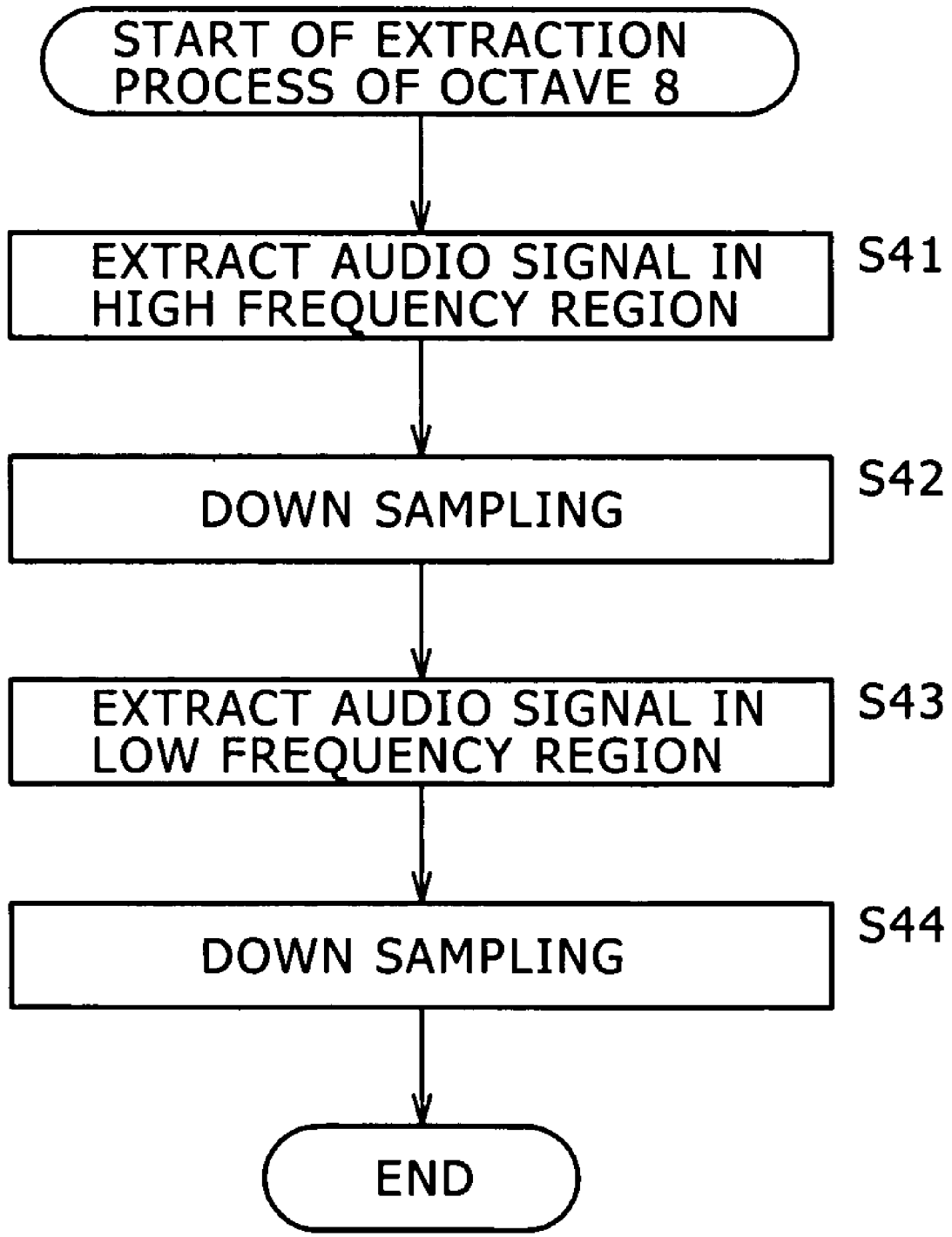
FIG. 12 is a flow chart illustrating an octave 8 extraction process illustrated in FIG. 11.

Now, the extraction process of the octave 8 by the octave dividing section $51_1$ of FIG. 4 is described with reference to a flow chart of FIG. 12. It is to be noted that the extraction process of the octave 8 corresponds to the process at step S21 of FIG. 11.

First at step S41, the HPF $71_1$ extracts, from among audio signals inputted thereto from the re-sampling section 21, audio signals in a high frequency region higher than one half the frequency band of the inputted audio signals, and outputs the extracted audio signals to the DS section $72_1$. Thereafter, the processing advances to step S42.

At step S42, the DS section $72_1$ down samples the audio signals inputted thereto from the HPF $71_1$ with a sampling frequency equal to one half the sampling frequency of the inputted audio signals, and outputs the audio signals after the down sampling as audio signals of the octave 8 to the BPFB $23_8$. Thereafter, the processing advances to step S43.

At step S43, the LPF $73_1$ extracts, from among the audio signals inputted thereto from the re-sampling section 21, audio signals in a low frequency region lower than one half of the frequency band of the inputted audio signals, and outputs the extracted audio signals to the DS section $74_1$. Thereafter, the processing advances to step S44.

At step S44, the DS section $74_1$ outputs the audio signals after the down sampling to the HPF $71_2$ and the LPF $73_2$ of the octave dividing section $51_2$. Thereafter, the processing is ended.

Processes similar to the processes at steps S41 to S44 are executed also by the octave dividing sections $51_2$ to $51_7$. However, in the octave dividing section $51_7$, the DS section $74_7$ outputs audio signals after down sampling to the HPF 75 as described hereinabove. Thus, the HPF 75 extracts, from among the audio signals after the down sampling from the DS section $74_7$, audio signals in a high frequency band higher than one half the frequency band of the audio signals, and outputs the extracted audio signals to the DS section 76. The DS section 76 samples the audio signals inputted thereto from the HPF 75 with a sampling frequency equal to one half the sampling frequency of the audio signals, and outputs the down sampled audio signals as audio signals of the octave 1 to the BPFB $23_1$ (FIG. 2).

Figure 13:
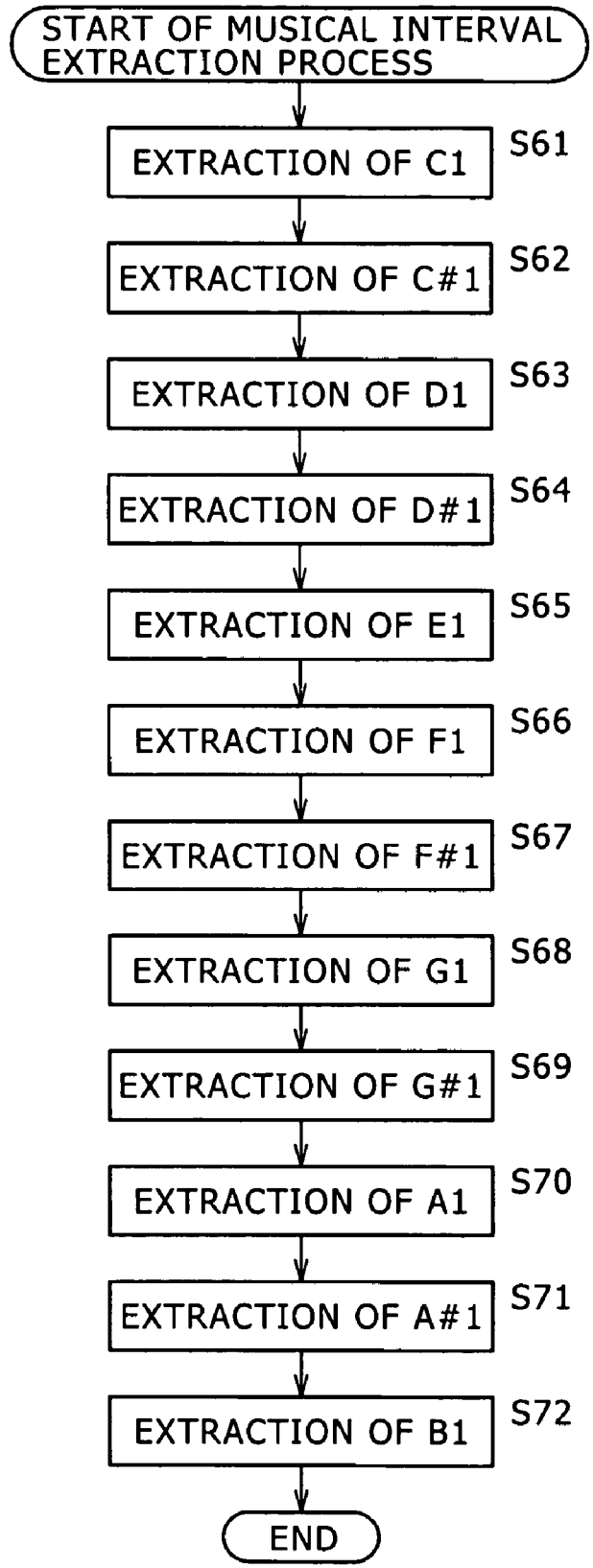
FIG. 13 is a flow chart illustrating a musical interval extraction process illustrated in FIG. 10.

Now, the musical interval extraction process of the BPFB $23_1$ of FIG. 7 is described with reference to a flow chart of FIG. 13. While the musical interval extraction process corresponds to the musical interval extraction process executed by the BPFB $23_1$ from within the musical interval extraction process at step S3 of FIG. 10, also the other BPFBs $23_2$ to $23_8$ execute processes similar to the musical interval detection process of FIG. 13 for the individual octaves 2 to 8, respectively.

First at step S61, the BPF $101_1$ extracts an audio signal of the musical interval of C1. In particular, the BPF $101_1$ extracts, from among audio signals of the octave 1 inputted from the octave dividing block 22 (FIG. 2), the audio signal of the musical interval of C1. Thereafter, the processing advances to step S62.

At steps S62 to S72, the BPFs $101_2$ to $101_{12}$ extract audio signals of the musical intervals of C#1, D1, D#1, E1, F1, F#1, G1, G#1, A1, A#1 and B1, respectively, similarly as in the extraction of the audio signal of the musical interval of C1 at step S61. Thereafter, the processing is ended.

It is to be noted that the processes at steps S61 to S72 may be executed in an arbitrary order other than the order described above with reference to FIG. 13 or may otherwise be executed parallelly (concurrently).

In this manner, the signal processing apparatus 11 can divide an audio signal inputted thereto into 8 octaves of the octaves 1 to 8 and further extract, for each of the octaves 1 to 8, audio signals of the 12 musical intervals of C, C#, D, D#, E, F, F#, G, G#, A, A# and B. In other words, the signal processing apparatus 11 can obtain signal components of different musical intervals of an audio signal inputted thereto in a time series.

Since the signals outputted from the signal processing apparatus 11 are signals of the 12 musical intervals of C, C#, D, D#, E, F, F#, G, G#, A, A# and B of each of the octaves 1 to 8, an apparatus which receives the outputs of the signal processing apparatus 11 can use the musical interval signals (musical interval information) as they are in an application such as automatic music transcription, music analysis (melody analysis) and so forth.

The number of times of arithmetic operation executed for one sample of an original audio signal to extract audio signals of the 12 musical intervals of the totaling eight octaves of the octaves 1 to 8 differs among different techniques for extraction of such audio signals. Now, the number of arithmetic operations performed by a simple technique (hereinafter referred to as related-art technique) which depends upon a BPF bank wherein one BPF is used for each one musical interval to extract audio signals of the individual musical intervals and the number of times arithmetic operation performed by another technique (hereinafter referred to as present technique) which uses the signal processing apparatus 11 of FIG. 1 to extract audio signals of the individual musical intervals are compared with each other. It is to be noted that the number of arithmetic operations is counted such that a set of one addition operation and one multiplication operation is counted as one.

FIG. 14 illustrates the number of times of arithmetic operations by the related-art technique.

According to the related-art technique, since down sampling is not performed, the down sampling number DS is 1 in all octaves of the octaves 1 to 8. Here, the down sampling number DS represents to what fraction the sample number of audio signals of an object of processing is reduced with respect to the sample number of an original audio signal. Thus, according to the related-art technique, since an original audio signal becomes an object of processing of BPFs for extracting signals of the musical intervals of the octaves, the down sampling number DS is always equal to 1.

Further, in the related-art technique, it is assumed that, for the BPFs for extracting audio signals of the musical intervals of the octave 8, an FIR (Finite Impulse Response) filter of 128 taps is used. Now, if it is tried to achieve a frequency resolution similar to that of the octave 8 with regard to each of the octaves 1 to 7, then there is the necessity to set the number of taps of the BPFs to twice that of the BPFs for extracting the musical intervals of the of the octave 8 as the musical intervals become lower by one octave from those of the octave 8. Accordingly, if the number of taps of each of the BPFs for extracting the musical intervals of the octave is 128 as described above, then the number Tap of taps for the octaves 1 to 7 is 16,384, 8,192, 4,096, 2,048, 1,024, 512 and 256, respectively.

Under such a condition as described above, the number of times of arithmetic operation of multiplication and addition performed per one sample of the original audio signal in order to obtain the musical intervals of each octave can be calculated by Tap÷DS×12. Accordingly, the number of times of arithmetic operation for individual ones of the octaves 1 to 8 (that is, the number of times of arithmetic operation per one sample of original audio signals necessary to determine each of the 12 musical intervals of each octave) is 196,608, 98,304, 49,152, 24,576, 12,288, 6,144, 3072 and 1,536, respectively. Therefore, according to the related-art technique, the number of times of arithmetic operation per one sample of original audio signals necessary to determine each of the 12 musical intervals of each of the 8 octaves of the octaves 1 to 8 is the sum of the values and 391,680.

FIG. 15 illustrates the numbers of times of arithmetic operations of the HPFs $71_j$ and the LPFs $73_j$ of the octave dividing sections $51_j$ (j=1, 2, . . . , 6, 7) of the present technique. It is to be noted here that the number of times of arithmetic operation of the LPF $73_7$ includes also the number of times of arithmetic operation of the HPF 75.

In the present technique, in order to achieve an extraction accuracy (performance) of musical intervals equal to that of the related-art technique of FIG. 14, each of the HPFs $71_j$ and the LPFs $73_j$ requires a number of taps approximately equal to 256. Therefore, in FIG. 15, the tap numbers Tap of the HPFs $71_j$ and the LPFs $73_j$ are both represented as 256.

Further, as described hereinabove with reference to FIG. 4, since each of the octave dividing sections $51_j$ performs ½ down sampling, the down sampling number DS of the octave 8 having the highest frequency band is 2, and the down sampling number DS is doubled together with every decrease of the frequency band by one octave. Accordingly, the down sampling numbers DS of the octaves 1 to 8 are 256, 128, 64, 32, 16, 8, 4 and 2, respectively.

The number of times of arithmetic operation of multiplication and addition performed per one sample of an original audio signal by both of the HPFs $71_j$ and the LPFs $73_j$ is determined by Tap÷DS×2. Accordingly, the numbers of times of arithmetic operation of multiplication and addition performed per one sample of original audio signals by both of the HPFs $71_j$ and the LPFs $73_j$ for the octaves 1 to 8 are 2, 4, 8, 16, 32, 64, 128 and 256, respectively, as seen in FIG. 15. Accordingly, the number of times of arithmetic operation of multiplication and addition performed per one sample of an original audio signal for frequency band division by the octave dividing block 22 is the sum of the numbers of times of arithmetic operation for the octaves and 510.

FIG. 16 illustrates the numbers of times of arithmetic operation by the BPFBs $23_1$ to $23_8$ of the present technique.

The down sampling numbers DS for the octaves 1 to 8 are 256, 128, 64, 32, 16, 8, 4 and 2 similarly as in FIG. 15. Meanwhile, the tap numbers Tap of the BPFBs $23_1$ to $23_8$ for extracting the musical intervals of the octaves 1 to 8 are all 64.

Accordingly, the numbers of times of arithmetic operation by the BPFBs $23_1$ to $23_8$ for the octaves 1 to 8 of the present technique (numbers of times of arithmetic operation per one sample of original audio signals necessary to determine the 12 individual musical intervals of an octave) are calculated by Tap÷DS×12 as seen in FIG. 16 and are 3, 6, 12, 24, 48, 96, 192 and 384, respectively. Accordingly, according to the present technique, the number of times of arithmetic operation per one sample of original audio signals necessary to determine the 12 musical intervals of the eight octaves of the octaves 1 to 8 is the sum of them and 765.

From the foregoing, the number of times of arithmetic operation according to the present technique is 1,275 which is the sum total of 510 which is the number of times of arithmetic operation by the HPFs $71_j$ and the LPFs $73_j$ of the octave dividing block 22 illustrated in FIGS. 15 and 765 which is the number of times of arithmetic operation by the BPFBs $23_1$ to $23_8$ illustrated in FIG. 16.

The number of times of arithmetic operation of the present technique (the number of times of arithmetic operation performed for an input of one sample of an original signal) is 1,275 and is extremely smaller than 391,680 which is the number of times of arithmetic operation of the related-art technique illustrated in FIG. 14. In particular, by employing down sampling, signals of individual musical intervals can be extracted from an original audio signal through a smaller amount of arithmetic operation than that of the related-art technique. In other words, according to the present technique, the amount of arithmetic operation (performance) required for extraction of signals of musical intervals can be reduced significantly when compared with the related-art technique.

While the series of processes described hereinabove with reference to FIGS. 10 to 13 can be executed by hardware for exclusive use, it may otherwise be executed by software. Where the series of processes described above are executed by software, for example, the series of processes can be implemented by causing a program to be executed by such a (personal) computer as shown in FIG. 17.

Referring to FIG. 17, a CPU (central processing unit) 301 executes various processes in accordance with a program stored in a ROM (Read Only Memory) 302 or a program loaded from a storage section 308 into a RAM (Random Access Memory) 303. Also data necessary for the CPU 301 to execute the processes are suitably stored into the RAM 303.

The CPU 301, ROM 302 and RAM 303 are connected to one another by a bus 304. Also an input/output interface 305 is connected to the bus 304.

An inputting section 306 including a keyboard, a mouse and so forth, an outputting section 307 including a display unit which may be a CRT (Cathode Ray Tube) or an LCD (Liquid Crystal Display) unit, a speaker and so forth, a storage section 308 formed from a hard disk or the like, and a communication section 309 including a modem, a terminal adapter and so forth are connected to the input/output interface 305. The communication section 309 performs a communication process through a network such as the Internet.

Further, as occasion demands, a drive 310 is connected to the input/output interface 305. A magnetic disk 321, an optical disk 322, a magneto-optical disk 323, a semiconductor memory 324 or the like is suitably loaded into the drive 310, and a computer program read from the loaded medium is installed into the storage section 308 as occasion demands.

While, in the embodiment described above, a set of every 12 musical intervals from the musical interval of C (do) to the musical interval of B (ti) is determined as one octave, one octave may be defined by a set of different musical intervals. For example, also where the 12 musical intervals from the musical interval of F (fa) to the musical interval of E (mi) is determined as one set, since the frequencies exhibit a logarithmic distribution, they can be regarded as one octave.

Also the sampling frequency in re-sampling of the re-sampling section 21 need not be a power-of two times a boundary frequency of an octave. In particular, the sampling frequency in re-sampling of the re-sampling section 21 may be, for example, a power-of two times a frequency on the boundary between adjacent musical intervals.

Further, if the sampling frequency of an original audio signal is a power-of two times a boundary frequency of an octave or a frequency of a boundary between musical intervals, then the signal processing apparatus 11 can be configured without provision of the re-sampling section 21.

It is to be noted that, in the present specification, the steps which are described in the flow charts may be but need not necessarily be processed in a time series in the order as described, and include processes which are executed in parallel or individually without being processed in a time series.

What is claimed is:

1. A signal processing apparatus for processing an audio signal, comprising:
    an octave dividing section for dividing an input signal into high frequency components on a high frequency band side and low frequency components on a low frequency band side and down sampling the high frequency components and the low frequency components individually to divide the audio signal into a plurality of signals of different octaves; and
    a filter section for filtering the signals of the different octaves to extract a plurality of signals of different musical intervals.

2. A signal processing apparatus according to claim 1, further comprising a re-sampling section for re-sampling the audio signal.

3. A signal processing apparatus according to claim 2, wherein said octave dividing section divides the input signal into the high frequency components and the low frequency components by which a frequency band of the input signal is divided equally into two frequency bands and performs down sampling of decreasing the number of samples to one half individually for the high frequency components and the low frequency components, and said re-sampling section re-samples the audio signal with a sampling frequency equal to a power-of two times a frequency at a boundary of each of the octaves.

4. A signal processing apparatus according to claim 1, wherein said filter section includes 12 band-pass filters having pass bands for audio signals of frequency ranges of 12 musical intervals.

5. A signal processing method for a signal processing apparatus which processes an audio signal, comprising:
    dividing an input signal into high frequency components on a high frequency band side and low frequency components on a low frequency band side and down sampling the high frequency components and the low frequency components individually to divide the audio signal into a plurality of signals of different octaves; and
    filtering the signals of the different octaves to extract a plurality of signals of different musical intervals.

6. A computer readable recording medium including computer executable instructions, wherein the instructions, when executed by a processor, cause the processor to perform a method comprising:
    dividing an input signal into high frequency components on a high frequency band side and low frequency components on a low frequency band side and down sampling the high frequency components and the low frequency components individually to divide the audio signal into a plurality of signals of different octaves; and
    filtering the signals of the different octaves to extract a plurality of signals of different musical intervals.

7. A signal processing apparatus for processing an audio signal, comprising:
    an octave dividing unit configured to divide an input signal into high frequency components on a high frequency band side and low frequency components on a low frequency band side and to down sample the high frequency components and the low frequency components individually to divide the audio signal into a plurality of signals of different octaves; and a filter configured to filter the signals of the different octaves to extract a plurality of signals of different musical intervals.

8. A signal processing apparatus according to claim 7, further comprising a re-sampling unit configured to re-sample the audio signal.

9. A signal processing apparatus according to claim 8, wherein said octave dividing unit is configured to divide the input signal into the high frequency components and the low frequency components by which a frequency band of the input signal is divided equally into two frequency bands and to perform down sampling by decreasing the number of samples to one half individually for the high frequency components and the low frequency components, and said re-sampling unit is configured to re-sample the audio signal with a sampling frequency equal to a power-of two times a frequency at a boundary of each of the octaves.

10. A signal processing apparatus according to claim 7, wherein said filter includes 12 band-pass filters having pass bands for audio signals of frequency ranges of 12 musical intervals.

* * * * *